(12) United States Patent
Ogawa et al.

(10) Patent No.: US 8,408,724 B2
(45) Date of Patent: Apr. 2, 2013

(54) LIGHT SOURCE MODULE AND LIGHTING APPARATUS

(75) Inventors: Kozo Ogawa, Yokosuka (JP); Yusuke Shibahara, Yokosuka (JP); Kiyoshi Nishimura, Yokosuka (JP); Seiko Kawashima, Yokosuka (JP); Tsuyoshi Oyaizu, Yokohama (JP); Haruki Takei, Kawasaki (JP)

(73) Assignee: Toshiba Lighting & Technology Corporation, Kanagawa (JP)

( * ) Notice: Subject to any disclaimer, the term of this patent is extended or adjusted under 35 U.S.C. 154(b) by 511 days.

(21) Appl. No.: 12/641,841

(22) Filed: Dec. 18, 2009

(65) Prior Publication Data

US 2010/0165624 A1    Jul. 1, 2010

(30) Foreign Application Priority Data

Dec. 26, 2008 (JP) ................................. 2008-334618
Jan. 9, 2009 (JP) ................................. 2009-003802
Nov. 20, 2009 (JP) ................................. 2009-265481

(51) Int. Cl.
*F21V 8/00* (2006.01)
(52) U.S. Cl. ................ 362/84; 362/97.3; 362/249.02; 362/235; 362/800; 362/561
(58) Field of Classification Search ................ 362/561, 362/237
See application file for complete search history.

(56) References Cited

U.S. PATENT DOCUMENTS

| | | | |
|---|---|---|---|
| 4,600,977 A * | 7/1986 | Barlian et al. | 362/392 |
| 5,836,676 A * | 11/1998 | Ando et al. | 362/244 |
| 6,479,930 B1 | 11/2002 | Tanabe | |
| 7,581,853 B2 * | 9/2009 | Kim et al. | 362/307 |
| 7,615,921 B2 | 11/2009 | Kimura | |
| 7,740,373 B2 | 6/2010 | Yoon et al. | |
| 7,791,092 B2 | 9/2010 | Tarsa et al. | |
| 7,855,449 B2 | 12/2010 | DeGraff et al. | |
| 7,942,550 B2 * | 5/2011 | Inoue et al. | 362/249.02 |
| 2005/0116619 A1 | 6/2005 | Kuma et al. | |

(Continued)

FOREIGN PATENT DOCUMENTS

| | | |
|---|---|---|
| CN | 1094657 | 11/2002 |
| CN | 1934721 | 3/2007 |

(Continued)

OTHER PUBLICATIONS

Chinese Office Action issued in CN 200910211992.1 on Dec. 31, 2010.

(Continued)

*Primary Examiner* — Sharon Payne
(74) *Attorney, Agent, or Firm* — DLA Piper LLP (US)

(57) ABSTRACT

A light source module includes a module substrate, a metal conductor, a plurality of semiconductor light emitting elements, a white diffuse reflection layer, and translucent sealing members. The metal conductor is provided in a predetermined pattern on a front surface of the module substrate. The semiconductor light emitting elements are electrically connected to the metal conductor and mounted on the front surface of the module substrate. The white diffuse reflection layer includes a plurality of holes in which the semiconductor light emitting elements are located, is thinner than the semiconductor light emitting elements, and is laminated to the front surface of the module substrate. The translucent sealing members bury the semiconductor light emitting elements, project below the diffuse reflection layer, and are mixed with a phosphor.

4 Claims, 12 Drawing Sheets

U.S. PATENT DOCUMENTS

| | | |
|---|---|---|
| 2005/0248929 A1 | 11/2005 | Kawamura |
| 2006/0124920 A1 | 6/2006 | Kimura |
| 2006/0192483 A1 | 8/2006 | Nakanishi |
| 2007/0023734 A1 | 2/2007 | Igarashi et al. |
| 2007/0023769 A1 | 2/2007 | Nishimoto |
| 2007/0123135 A1 | 5/2007 | Yang et al. |
| 2007/0159043 A1 | 7/2007 | Kubota |
| 2008/0043473 A1 | 2/2008 | Matsui |
| 2008/0094835 A1 | 4/2008 | Marra |
| 2008/0129653 A1 | 6/2008 | Yamazaki |
| 2008/0137008 A1 | 6/2008 | Rogojevic |
| 2008/0191620 A1* | 8/2008 | Moriyama et al. ............ 313/506 |
| 2009/0045722 A1 | 2/2009 | Bai et al. |
| 2009/0058278 A1 | 3/2009 | Ushikubo et al. |
| 2009/0189516 A1 | 7/2009 | Kurata |
| 2009/0212696 A1 | 8/2009 | Terao |
| 2009/0230853 A1 | 9/2009 | Kanai |
| 2009/0310335 A1 | 12/2009 | Park |
| 2010/0039023 A1 | 2/2010 | Rogojevic |
| 2010/0046232 A1 | 2/2010 | Matsui |
| 2010/0096965 A1 | 4/2010 | Oyaizu et al. |
| 2010/0149783 A1 | 6/2010 | Takenaka et al. |
| 2011/0222264 A1 | 9/2011 | Matsuda et al. |

FOREIGN PATENT DOCUMENTS

| | | |
|---|---|---|
| CN | 1945099 | 4/2007 |
| CN | 1992364 | 7/2007 |
| CN | 101084585 | 12/2007 |
| CN | 201003739 | 1/2008 |
| EP | 1 850 399 | 10/2007 |
| JP | 3-119573 | 12/1991 |
| JP | H05-152609 | 6/1993 |
| JP | 2001-068742 | 3/2001 |
| JP | 2002-057376 | 2/2002 |
| JP | 2003-068111 | 3/2003 |
| JP | 2003-45206 | 12/2003 |
| JP | 2004-193357 | 7/2004 |
| JP | 2005-101296 | 4/2005 |
| JP | 2006-261702 | 2/2006 |
| JP | 2007-80533 | 3/2007 |
| JP | 2008-108835 | 5/2008 |
| JP | 2008-147610 | 6/2008 |
| JP | 2008-218238 | 9/2008 |
| JP | 2008-227412 | 9/2008 |
| JP | 2008-288412 | 11/2008 |
| JP | 2009-99510 | 5/2009 |
| JP | 2010/080117 | 4/2010 |
| JP | 2010-92993 | 4/2010 |
| WO | WO 2008/127064 | 10/2008 |
| WO | WO 2008/156020 | 12/2008 |
| WO | WO 2009/041171 | 4/2009 |

OTHER PUBLICATIONS

English Language Translation of Chinese Office Action issued in CN 200910211992.1 on Dec. 31, 2010.
English Language Abstract of CN 201003739 published on Jan. 9, 2008.
English Translation of CN 1945099 published Apr. 4, 2007.
U.S. Appl. No. 12/581,911.
U.S. Appl. No. 12/634,710.
U.S. Appl. No. 13/256,649.
Chinese Office Action issued in CN 200910261396.4 on Mar. 18, 2011.
English Translation of Chinese Office Action issued in CN 200910261396.4 on Mar. 18, 2011.
English Language Abstract of CN 101084585 published Dec. 5, 2007.
English Language Abstract of CN 1992364 published Jul. 4, 2007.
English Abstract of JP 2010-080117 published Apr. 8, 2010.
English Translation of JP 2010-080117 published Apr. 8, 2010.
U.S. Appl. No. 13/045,787.
A. R. Robertson, "The CIE 1976 Color-Difference Formulae," Color Research and Application, vol. 2, No. 1, p. 7-11, Spring 1977.
English Language Abstract of JP 2003-045206 published Feb. 14, 2003.
English Language Translation of JP 2003-045206 published Feb. 14, 2003.
English Language Abstract of JP 2005-101296 published Apr. 14, 2005.
English Language Translation of JP 2005-101296 published Apr. 14, 2005.
English Language Abstract of JP 2006-261702 published Sep. 28, 2006.
English Language Translation of JP 2006-261702 published Sep. 28, 2006.
English Language Abstract of JP 2007-080533 published Mar. 29, 2007.
English Language Translation of JP 2007-080533 published Mar. 29, 2007.
English Language Abstract of JP 2008-288412 published Nov. 27, 2008.
English Language Translation of JP 2008-288412 published Nov. 27, 2008.
English Language Abstract of JP 2009-099510 published Jul. 7, 2009.
English Language Translation of JP 2009-099510 published Jul. 7, 2009.
English Language Abstract of JP 2010-092993 published Apr. 22, 2010.
English Language Translation of JP 2010-092993 published Apr. 22, 2010.
U.S. Appl. No. 13/256,649, filed Sep. 15, 2011.
English Language Abstract of JP 2008-227412 Published on Sep. 25, 2008.
English Language Translation of JP 2008-227412 Published on Sep. 25, 2008.
English Language Abstract of JP 2002-057376 Published on Feb. 22, 2002.
English Language Translation of JP 2002-057376 Published on Feb. 22, 2002.
Office Action issued in CN 200910179891 mailed Jan. 19, 2011.
English Language Abstract of CN 1094657 published Nov. 20, 2002.
Japanese Office Action issued in JP 2010-055564 on Oct. 31, 2012.
English Language Translation of Japanese Office Action issued in JP 2010-055564 on Oct. 31, 2012.
English Language Abstract of JP 2008-108835 published May 8, 2008.
English Language Translation of JP 2008-108835 published May 8, 2008.
English language abstract of JP-2004-193357, (2004).
Machine English language translation of JP-2004-193357, (2004).
English language abstract of JP-2003-068111, (2003).
Machine English language translation of JP-2003-068111, (2003).
English language abstract of JP-3-119573, (1991).
English language abstract of JP-2008-218238, (2008).
Machine English language translation of JP-2008-218238, (2008).
English language abstract of JP-2008-147610, (2008).
Machine English language translation of JP-2008-147610, (2008).
English language abstract of JP-H05-152609, (1993).
Machine English language translation of JP-H05-152609, (1993).
Japanese Office Action issued in JP 2009-003802 on Nov. 20, 2012.
English Language Translation of Japanese Office Action issued in JP 2009-003802 on Nov. 20, 2012.
English Language Abstract of JP 2001-068742 published Mar. 16, 2001.
English Language Translation of JP 2001-068742 published Mar. 16, 2001.
European Search Report issued in EP 09015879 on Nov. 26, 2012.

* cited by examiner

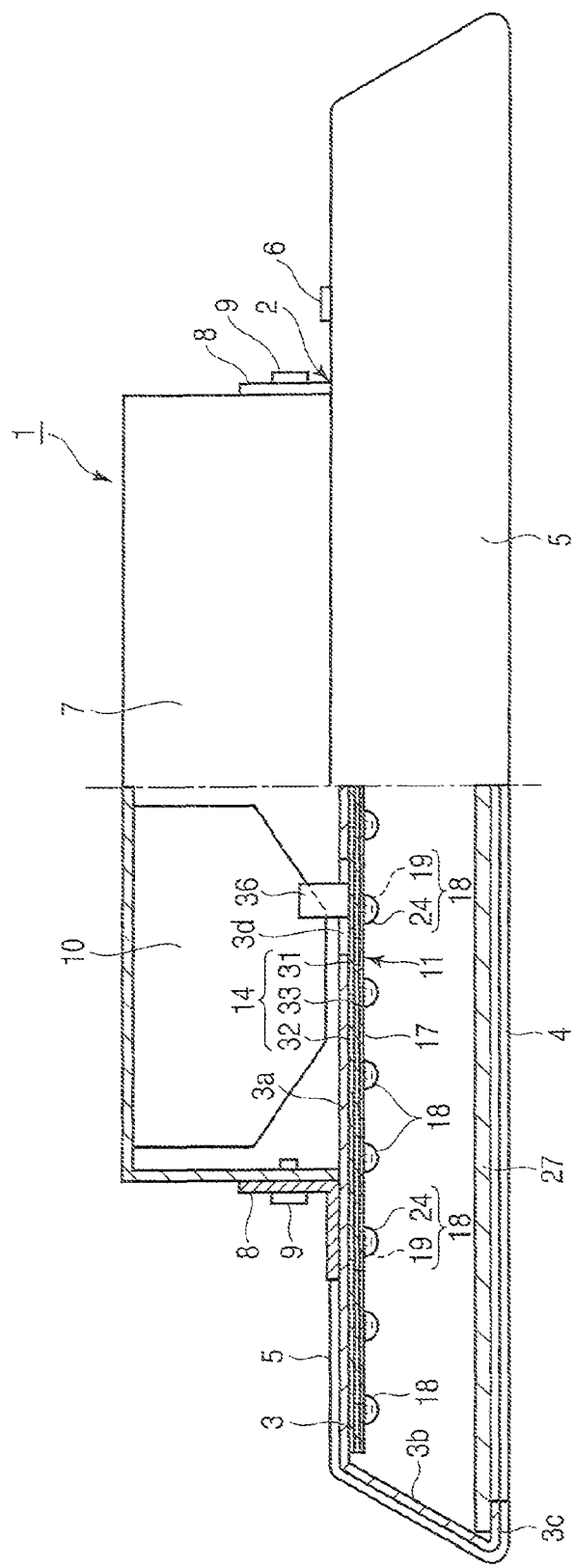
F I G. 4

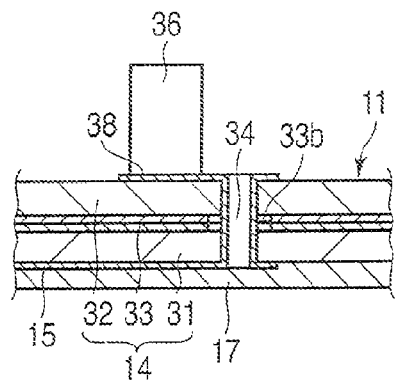
F I G. 9
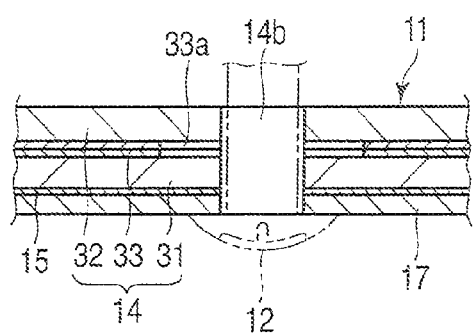
F I G. 10
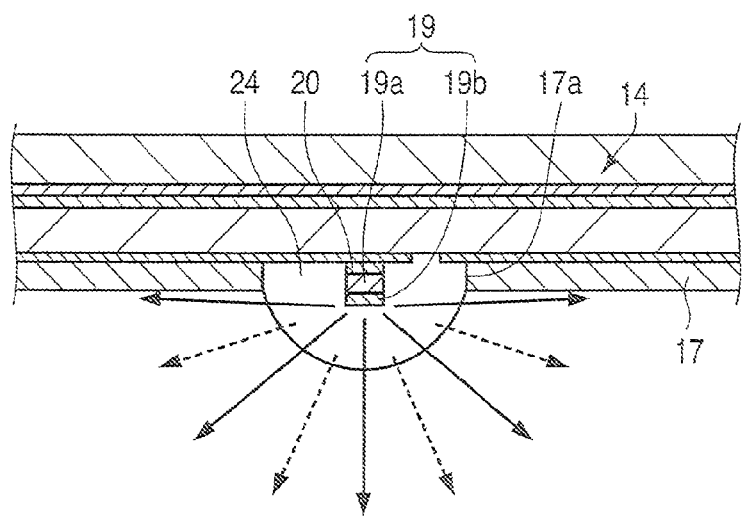
F I G. 11

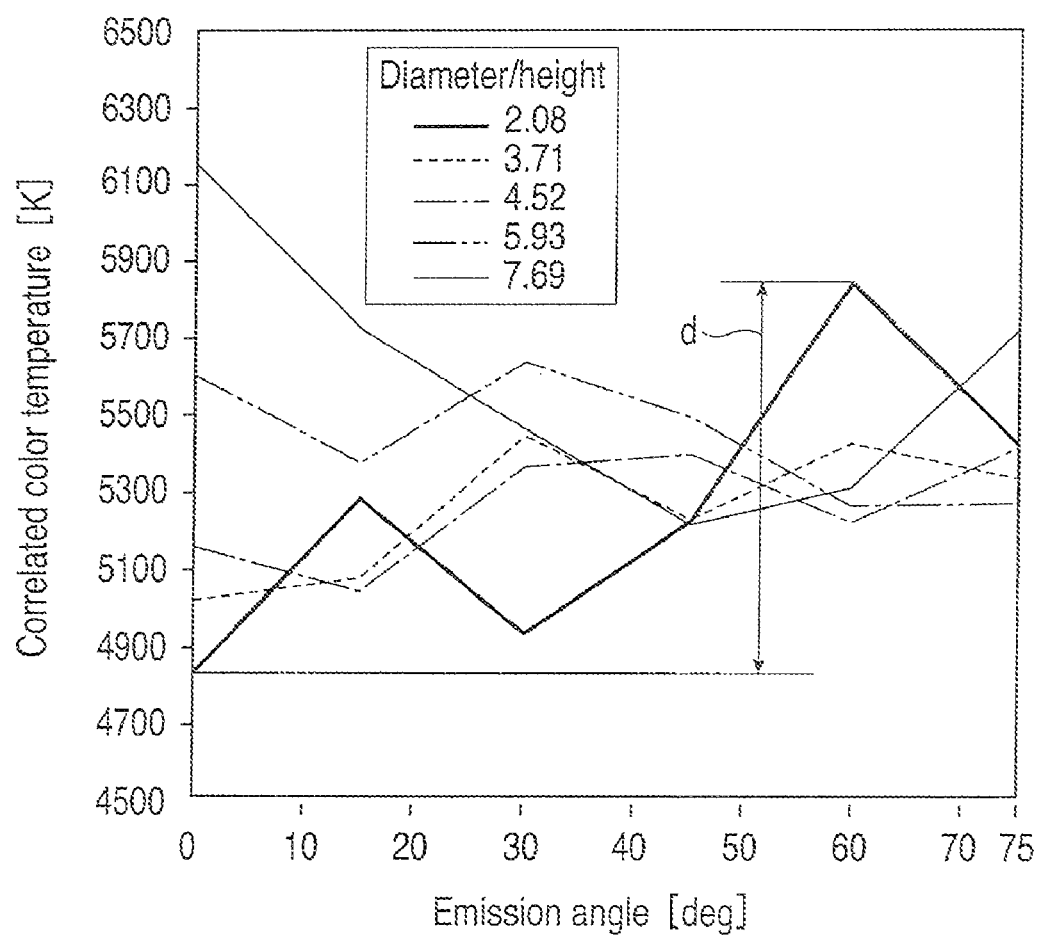
F I G. 16

LIGHT SOURCE MODULE AND LIGHTING APPARATUS

CROSS-REFERENCE TO RELATED APPLICATIONS

This application is based upon and claims the benefit of priority from prior Japanese Patent Applications No. 2008-334618, filed Dec. 26, 2008; No. 2009-003802, filed Jan. 9, 2009; and No. 2009-265481, filed Nov. 20, 2009, the entire contents of all of which are incorporated herein by reference.

BACKGROUND OF THE INVENTION

1. Field of the Invention

One embodiment of the invention relates to a light source module provided with a plurality of semiconductor light emitting elements configured to emit light together and a lighting apparatus comprising the light source module.

2. Description of the Related Art

Conventionally known are LED light source units that comprise a plurality of light emitting diode (LED) bare chips configured to emit blue or ultraviolet light. In an LED light source unit described in Jpn. Pat. Appln. KOKAI Publication No. 2004-193357 (Patent Document 1), a plurality of LED bare chips are regularly mounted on a metal base printed board. A conductor pattern is formed on an insulating layer of the printed board. The bare chips are connected to the conductor pattern. A reflector is located on the metal base printed board. The reflector comprises a plurality of tapered holes that accommodate the bare chips, individually. Each hole is filled with a translucent sealing resin mixed with phosphor powder.

The LED light source unit described in Patent Document 1 is used as a planar light source in which the bare chips are caused to emit light together. The blue or ultraviolet light emitted from each bare chip is changed into white light by the phosphor powder as it is transmitted through the sealing resin. This white light serves for illumination when its projection direction is regulated by the respective inner surfaces of the tapered holes of the reflector that is much thicker than each bare chip.

An LED light source unit comprising neither a phosphor nor reflector is also described in Patent Document 1. In this LED light source unit, LED bare chips mounted on a second layer (insulating layer) of the metal base printed board are individually sealed with the sealing resin.

LED bare chips are known as highly luminous point light sources. In the LED light source unit of Patent Document 1 that is used as a planar light source, luminous parts or high-luminance points comprising separately arranged LED bare chips and a sealing resin covering the chips are visually recognized as "lumpy". Therefore, discomfort glare is easily produced by luminance unevenness.

In the LED light source unit of Patent Document 1 comprising the reflector with the tapered holes, in particular, the directions of all light components emitted from the luminous parts are regulated by the reflector holes and directly projected downward. Thus, the luminance unevenness is more conspicuous, and hence, produces discomfort glare more easily.

In the case of the LED light source unit of Patent Document 1 that does not use a reflector, it is uncertain whether the discomfort glare attributable to the luminance unevenness can be improved or not. This is because the technique of Patent Document 1 is configured so that an exposed region of the conductor pattern formed on the metal base printed board is covered by the sealing resin with which the LED bare chips are sealed and that other regions of the conductor pattern than the exposed region are not exposed from the printed board. The moisture-proof property of the unit is improved with this arrangement. Thus, the improvement of glare attributable to luminance unevenness is not described at all in Patent Document 1.

Further, the LED light source unit of Patent Document 1 without a reflector is not contrived so that the respective sealed shapes of the individual LED bare chips are uniform, despite the fixed amount of sealing resin used for each chip. Thus, the sealing resin that seals the individual LED bare chips is variously distorted, so that uniform shape, height, etc., cannot be ensured. Therefore, if the LED light source unit includes such sealing resin mixed with the phosphor powder, the luminous parts are different in luminous color. The differences in shape and height between the luminous parts are visually recognized as color unevenness.

The lighting apparatus incorporating the LED light source unit that is liable to the aforementioned luminance or color unevenness has a poor appearance. Therefore, it is advisable to increase the commodity value of the lighting apparatus by improving this point.

Preferably, the lighting apparatus may comprise a translucent cover for use as a guard that prevents a user's hand from touching live parts (wiring pattern, LED bare chips, etc.) or the like. In applications where discomfort glare produced by the LED light source is a problem, therefore, the luminance unevenness or color unevenness can be improved by using a cover with diffusivity suitable for the applications.

Thus, if a milky cover that is the highest in diffusivity is used, for example, the luminance unevenness can be reduced by mitigating the "lumpiness" of the luminous parts based on a light diffusion effect of the cover. If the milky cover is used, however, the luminous fluxes of the lighting apparatus are reduced by 10% when compared with luminaire fluxes produced with use of a transparent cover. Thus, the efficiency of the lighting apparatus is inevitably reduced, all the same.

BRIEF SUMMARY OF THE INVENTION

The object of the present invention is to provide a light source module and a lighting apparatus, capable of being reduced in luminance unevenness caused by luminous parts and improved in appearance.

A light source module according to a first aspect of the invention comprises a module substrate, a metal conductor provided in a predetermined pattern on a front surface of the module substrate, a plurality of semiconductor light emitting elements electrically connected to the metal conductor and mounted on the front surface of the module substrate, a white diffuse reflection layer comprising a plurality of holes in which the semiconductor light emitting elements are located, being thinner than the semiconductor light emitting elements, and laminated to the front surface of the module substrate, and translucent sealing members burying the semiconductor light emitting elements, projecting below the diffuse reflection layer, and mixed with a phosphor.

In the first aspect of the invention, a metal base board comprising a metal base layer and an insulating layer laminated thereto can be used as the module substrate. The insulating layer is formed of an insulating material such as a synthetic resin. A material with good thermal conductivity, e.g., aluminum, may be used for the metal base layer. Further, the module substrate may be a single- or multiple-layer board formed of an insulating material, such as a synthetic resin or inorganic material, e.g., a ceramic. The module substrate may be, for example, a resin board consisting mainly of glass-epoxy resin, which is relatively low in thermal conductivity and low-priced, or nonmetallic board of a paper-phenol material or glass composite, which is also relatively low-priced. Preferably, moreover, the module substrate may be formed in a quadrangular shape, e.g., a square or, rectangular shape, in order to arrange the semiconductor light emitting elements at desired intervals. Alternatively, the module substrate may be of a polygonal shape, e.g., hexagonal shape, or circular or elliptic shape.

In the first aspect of the invention, the front surface of the module substrate is a lower surface that is located on the front side of a lighting apparatus. In a case where the light source module is mounted in a lighting apparatus with a translucent cover, the front surface is covered by the translucent cover and opposed to the inner surface (back surface) of the cover. If the light source module is mounted in a lighting apparatus without a translucent cover, it can be visually recognized through an open part of an apparatus main body.

In the first aspect of the invention, chip light emitting diodes (LEDs) can be used as the semiconductor light emitting elements. More specifically, blue chip LEDs that emit, for example, blue or ultraviolet light can be used as the semiconductor light emitting elements. For white light emission, for example, it is advisable to combine the phosphor and blue LEDs. Alternatively, chip groups that emit white light may be formed by combining red, blue, and green chip LEDs that emit red, blue, and green light components, respectively. Preferably, according to this aspect, the semiconductor light emitting elements or chip groups may be dotted throughout the module substrate and arranged in a matrix based on, for example, the chip-on-board (COB) technology. The layout of the semiconductor light emitting elements is not limited to the shape of a matrix, and the elements may alternatively be dotted radially or in zigzags throughout the module substrate, depending on the substrate shape.

If the semiconductor light emitting elements are blue LEDs, moreover, they may be combined with a yellow phosphor that emits yellow light when excited by blue light, in order to achieve white light emission. For improved color rendering properties, a red or green phosphor may be mixed with the yellow phosphor. In the combination of the blue LEDs and phosphors, furthermore, the translucent sealing members of a transparent silicone resin or the like mixed with the phosphor may be disposed in the form of a phosphor layer with all the blue LEDs embedded therein and laminated to the module substrate. Alternatively, the translucent sealing members mixed with the phosphor may be disposed in such a manner that the blue LEDs or chip groups are embedded therein one by one. In the latter case, the amounts of the phosphor and sealing members used are less than in the former case, so that the cost can be reduced.

In the first aspect of the invention, the white diffuse reflection layer may be a previously bored sheet affixed to the front surface of the module substrate. Alternatively, the diffuse reflection layer may be a print layer, e.g., a white resist layer, which is applied by screen printing or the like to the whole front surface of the module substrate except those parts which correspond to the holes. The white diffuse reflection layer is expected to be whitish. For the improvement of luminance unevenness, the reflectance of the diffuse reflection layer may be 85% or more. Further, the holes of the reflection layer may be of any shape.

In the first aspect of the invention, the sealing members may be formed of a translucent synthetic resin, e.g., a transparent silicone resin that is resistant to heat and ultraviolet rays. Other translucent sealing materials may alternatively be used for the sealing members. The sealing members may be of any of various shapes, columnar, prismatic, or hemispherical. Further, the sealing members may be larger than the holes of the diffuse reflection layer. Specifically, the sealing members need not always be sealed in the holes and may be spread outside the holes. Thus, the sealing members may be allowed to overreach the diffuse reflection layer.

In the first aspect of the invention, the phosphor mixed in the sealing members is a substance that is excited by light emitted from the semiconductor light emitting elements and emits light of a wavelength different from that of the light emitted from the emitting elements. If the semiconductor light emitting elements are blue LEDs, for example, the yellow phosphor can be used to produce white light. The phosphor may be another one than the yellow phosphor or a yellow phosphor mixed with a green or red phosphor for improved color rendering properties.

In the first aspect of the invention, a part of light emitted from a luminescent layer of each semiconductor light emitting element is transmitted through the sealing member and excites the phosphor while the light source module is on. White light, for example, is created as the excited light is mixed with those components of the light emitted from the luminescent layer which have not excited the phosphor. The white light is emitted in the direction of light application and illuminates an underlying space through, for example, a translucent cover.

In this illumination, the respective luminescent layers of the semiconductor light emitting elements radiate light in all directions. In this lighting apparatus, therefore, the white light created based on light components emitted horizontally and obliquely upward from the luminescent layers and emitted from the sealing members is applied to the diffuse reflection layer. The applied light is diffusely reflected downward in the direction of light application by the reflection layer.

Thus, the luminance in the vicinity of each luminous part, comprising the semiconductor light emitting element and the sealing member in which the element is embedded, can be prevented from becoming much higher than that in the periphery. Specifically, the luminance in the region just below each luminous part is more reluctant to increase for the diffuse reflection. Moreover, the luminance around the luminous part is increased by the light diffusely reflected there, and the luminance ratio for this region is reduced. Consequently, unevenness of the luminance of each light source module can be reduced, so that discomfort glare can be reduced to improve the appearance of the apparatus.

Thus, according to the first aspect of the invention, the luminance unevenness caused by the luminous parts of each light source module can be reduced by the configuration of the module itself, so that the appearance of the apparatus can be improved.

In a light source module according to a second aspect of the invention, based on the first aspect, distal ends of the semiconductor light emitting elements project below the diffuse reflection layer. The "height of each semiconductor light emitting element" is a dimension from the lower surface of the module substrate to the distal end (i.e., lower end) of the light emitting element. In the case where the semiconductor light emitting element is fixed to the module substrate by some fixing member (e.g., die-bonding material), its height is, for example, equal to the sum of its thickness and that of the fixing member.

In the second aspect of the invention, each semiconductor light emitting element projects below the diffuse reflection layer, so that blue light from the element can also be radiated in directions near a horizontal direction without being greatly influenced by the reflection and light absorption by the diffuse reflection layer. Thus, blue and yellow light components are mixed together in the regions near the horizontal direction of each luminous part, as well as in the region vertically or obliquely below the luminous part, whereby white light is emitted. Consequently, the color of the light emitted vertically or obliquely below the luminous part is substantially the same as that of the light emitted near the horizontal direction, so that production of angular color differences can be suppressed.

In a light source module according to a third aspect of the invention, based on the first aspect, the sealing members are stemmed individually by the holes of the diffuse reflection layer. Although the holes of the reflection layer according to the third aspect may be circular, they need not always be so.

If the sealing members are disposed by potting according to the third aspect of the invention, the potted unhardened sealing members can be stemmed and prevented from further spreading by the holes of the diffuse reflection layer as it is hardened. Accordingly, the sealing members cannot be easily distorted by spreading along the surface of the diffuse reflection layer, so that they can be easily formed into the same shape. Thus, conditions for exciting the respective phosphors of the luminous parts are reluctant to variation, so that color unevenness attributable to the correlation between the luminous parts cannot be easily caused. Consequently, the appearance of the lighting apparatus can be further improved as the color unevenness is reduced.

In a light source module according to a fourth aspect of the invention, based on the first aspect, each of the sealing members is formed having a substantially spherical surface with a diameter-to-height ratio of 2.0~7.8 to 1.

In the fourth aspect of the invention, a correlated color temperature difference is confined to 1,000 K or less, so that angular color differences are too small to be annoying to users.

A lighting apparatus according to a fifth aspect of the invention comprises a light source module of any one of the first to fourth aspects, an apparatus main body comprising a base wall portion and an open bottom portion underlying the base wall portion, the light source module being fixed to a lower surface of the base wall portion, and a translucent cover supported by the apparatus main body, closing the open bottom portion, and covering the light source module from below.

In the fifth aspect of the invention, a transparent, semitransparent, or milky cover may be used as the translucent cover, depending on the operating environment of the lighting apparatus. For example, a transparent cover may be used in an environment where the luminance unevenness is not a serious problem at all. A semitransparent cover may be used in an environment where the luminance unevenness is a minor problem. Further, a milky cover may be used in an environment where the luminance unevenness is a serious problem.

In the lighting apparatus of the fifth aspect, as described above, the luminance unevenness caused by the dot-like luminous parts of each light source module can be reduced by the configuration of the module itself, so that the appearance of the apparatus can be improved. Therefore, the translucent cover need not be dedicated to the reduction of the luminance unevenness, so that the luminance unevenness reduction performance required of the cover can be mitigated. Thus, the low-diffusivity cover can be used in the lighting apparatus that is employed in an operating environment where the luminance unevenness is a problem. Consequently, a reduction in efficiency of the apparatus can be mitigated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 4 is an exemplary sectional view of the lighting apparatus taken along line F4-F4 of FIG. 2;

FIG. 9 is an exemplary sectional view of the light source module taken along line F9-F9 of FIG. 5;

FIG. 10 is an exemplary sectional view of the light source module taken along line F10-F10 of FIG. 5;

FIG. 11 is an exemplary partially enlarged view of the light source module shown in FIG. 8;

FIG. 16 is an exemplary diagram showing relationships between the emission angle and correlated color temperature of the light source module shown in FIG. 8.

DETAILED DESCRIPTION OF THE INVENTION

Figure 1:
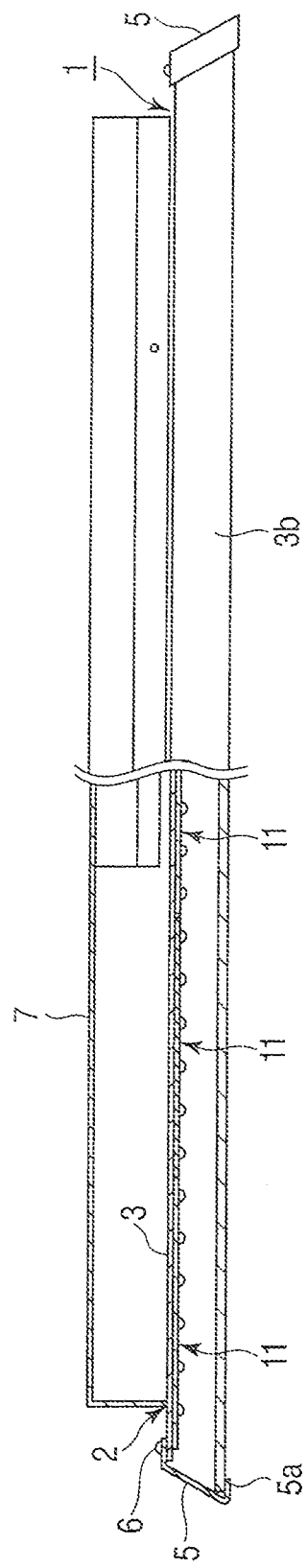
FIG. 1 is an exemplary side view, partially in section, showing a lighting apparatus according to one embodiment of the invention.

One embodiment of the present invention will now be described with reference to FIGS. 1 to 16.

In FIGS. 1 to 4, number 1 denotes a lighting apparatus. The lighting apparatus 1 is realized as a luminaire generally called a base light. The lighting apparatus 1 is directly attached to or embedded in an interior or exterior ceiling unit and installed for general lighting. This lighting apparatus 1 comprises an apparatus main body 2, glow starters 10, one or more light source modules 11, and translucent cover 27.

The apparatus main body 2 comprises a main body base 3, a pair of endplates 5, and main body housing 7, all of which are metallic. The main body 2 measures, for example, about 280 mm in vertical dimension in FIG. 2 (i.e., width) and 850 mm in lateral dimension in FIG. 2 (i.e., length).

As shown in FIGS. 1 to 4, the main body base 3 comprises a base wall portion 3a, sidewall portions 3b, and base lower edge portions 3c. The base wall portion 3a is a flat quadrangular (e.g., rectangular) plate. The sidewall portions 3b are bent obliquely downward from the opposite side edges of the base wall portion 3a. The base lower edge portions 3c are bent horizontally from the respective lower ends of their corresponding sidewall portions 3b.

For example, a plurality of component passage holes 3d (e.g., quadrangular holes) are bored through the base wall portion 3a. The component passage holes 3d are as many as the light source modules 11 (mentioned later) and are arranged at longitudinal intervals equal to those between the modules 11 with respect to main body base 3.

The respective inner surfaces of the pair of sidewall portions 3b are reflective surfaces opposed to each other. These sidewall portions 3b are inclined so that a space between their inner surfaces gradually becomes greater with distance from the base wall portion 3a. The base lower edge portions 3c are bent toward each other.

The endplates 5 are fixed individually to longitudinally opposite end parts of the main body base 3 by screws 6 so as to close the longitudinal ends of the base 3. These endplates 5 also have reflective inner surfaces and are inclined so that a space between the inner surfaces gradually becomes greater with distance from the base wall portion 3a. Lower edge portions 5a of the endplates 5 are bended horizontally and toward each other. Respective lower edge portions 5a of the endplates 5 and the base lower edge portions 3c are continuous with one another and form an open bottom portion 4 (FIGS. 3 and 4) opposed to, for example, the base wall portion 3a from below.

Figure 2:
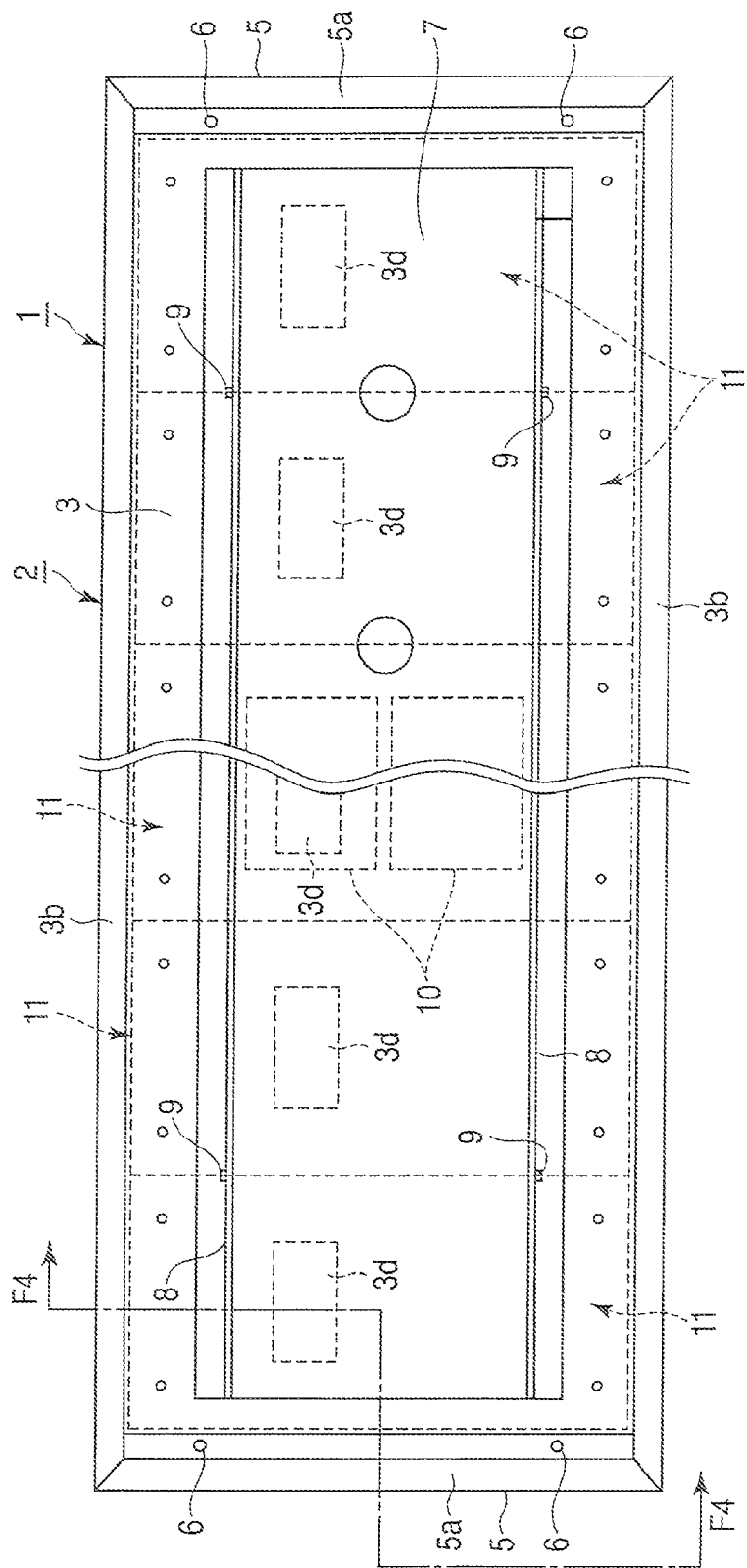
FIG. 2 is an exemplary top view of the lighting apparatus shown in FIG. 1.

As shown in FIGS. 1 and 4, the main body housing 7 is in the form of an open-bottomed rectangular box. The housing 7 is fixed to the upper surface of the main body base 3. More specifically, as shown in FIGS. 2 and 4, a pair of connecting metal fittings 8 are fixed to the upper surface of the base wall portion 3a so as to extend in the same direction as the length of the base wall portion 3a. The main body housing 7 is located between the connecting metal fittings 8. Lower edge portions of the main body housing 7 are fixed individually to the connecting metal fittings 8 by screws 9.

The glow starters 10 for lighting the light source modules 11 are fixed to the inner surface of a ceiling wall of the main body housing 7.

Figure 3:
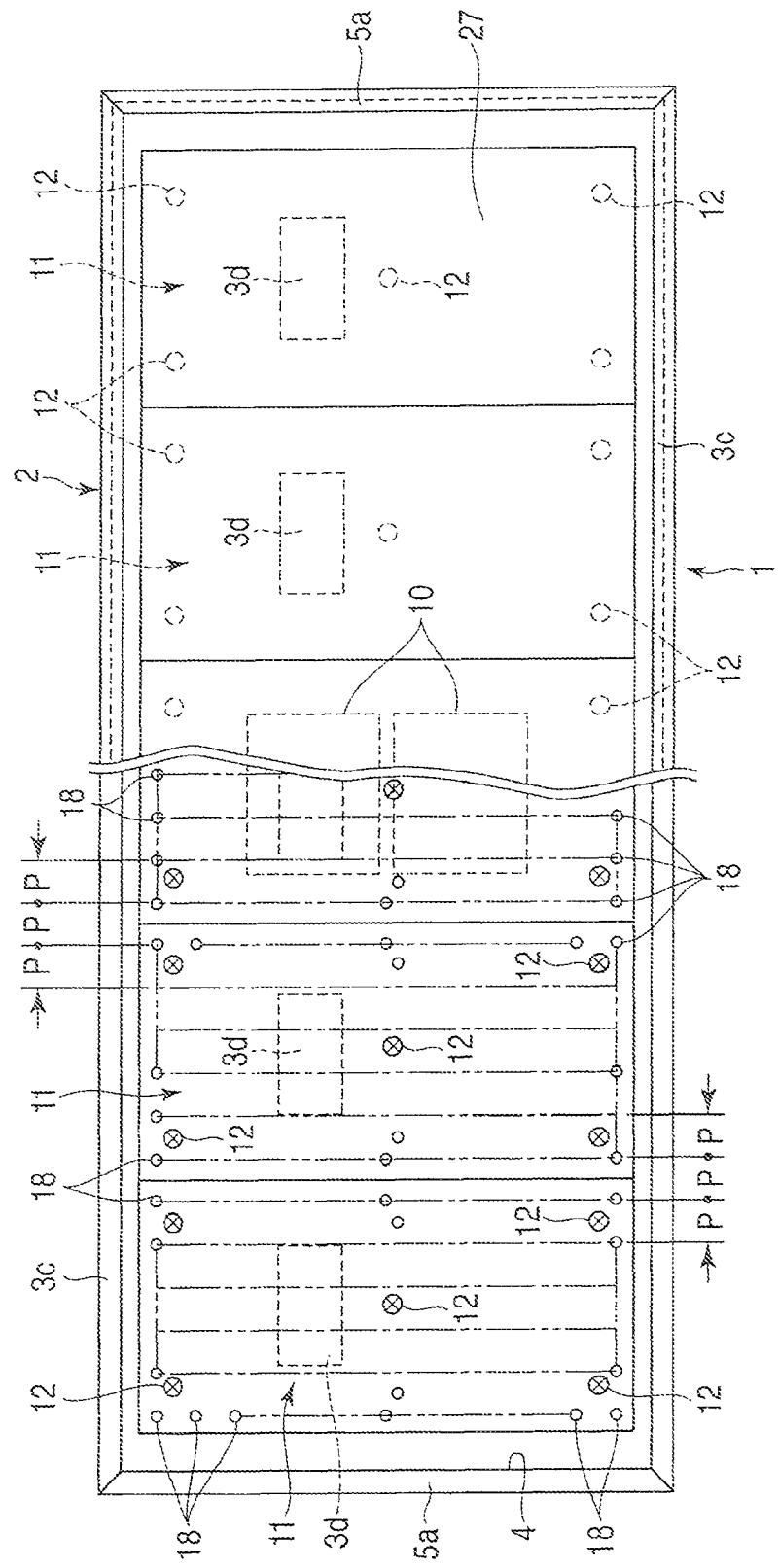
FIG. 3 is an exemplary cutaway bottom view of a cover of the lighting apparatus shown in FIG. 1.

The light source modules 11 are fixed to the lower surface of the base wall portion 3a by screws 12 (FIG. 3). The adjacent modules 11 are continuously in contact with one another without gaps. Thus, the modules 11 are disposed substantially over the entire area of the base wall portion 3a, as shown in FIGS. 2 and 3. The light source modules 11 arranged in this manner form a planar light source unit.

Each light source module 11 is a chip-on-board (COB) module. Each module 11 comprises a module substrate 14, metal conductors 15, white diffuse reflection layer 17, semiconductor light emitting elements such as blue light emitting diodes (LEDs) 19, and translucent sealing members 24.

Figure 5:
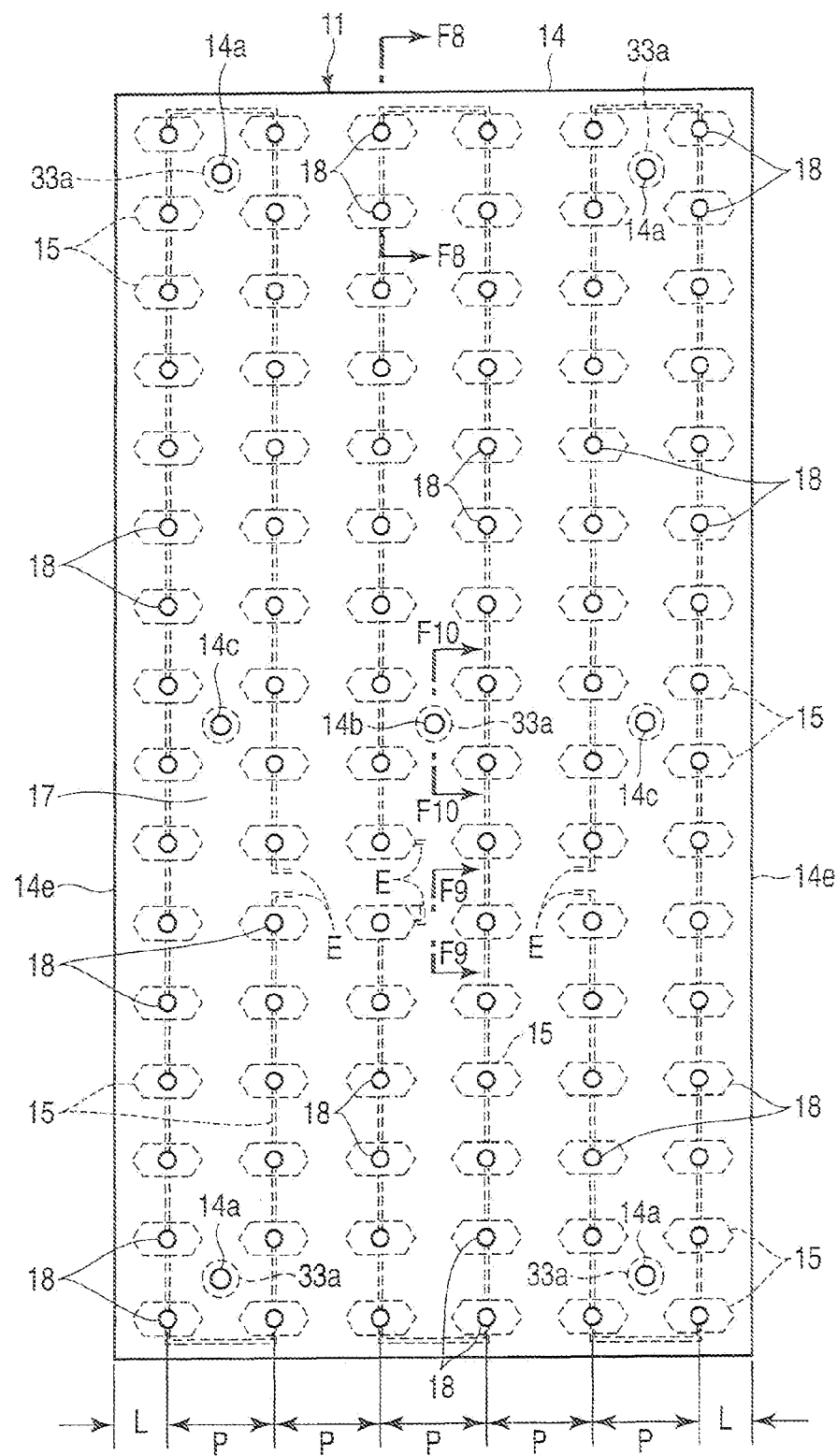
FIG. 5 is an exemplary bottom view showing a light source module of the lighting apparatus shown in FIG. 3.
Figure 8:
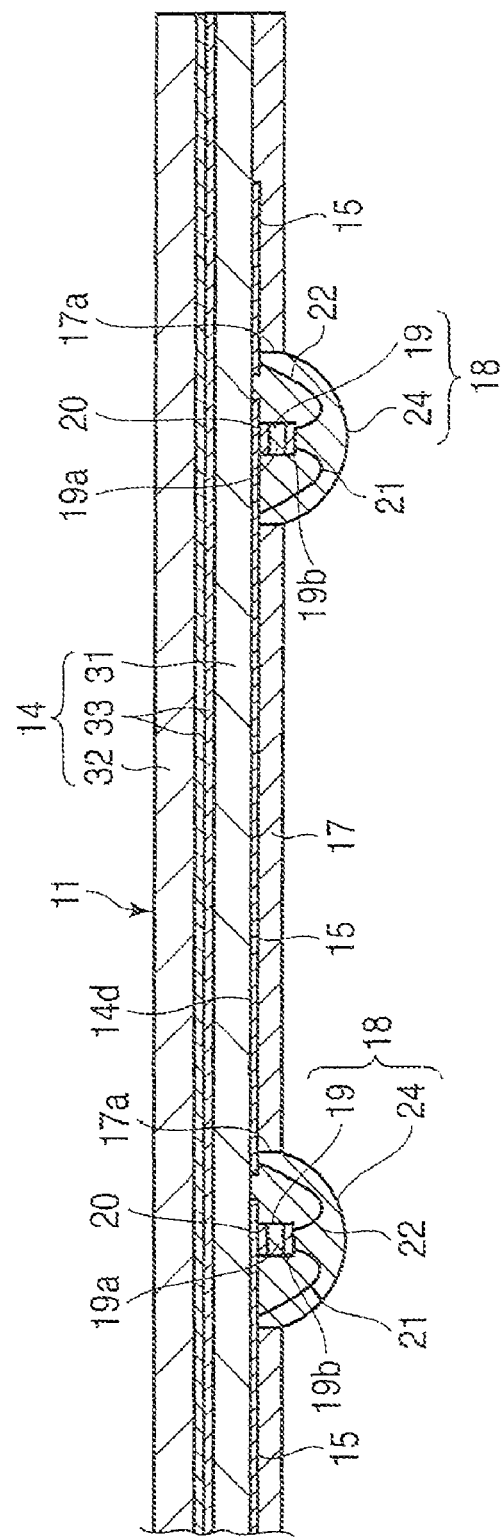
FIG. 8 is an exemplary sectional view of the light source module taken along line F8-F8 of FIG. 5.

The module substrate 14 is a multi-layer substrate having a quadrangular shape (e.g., rectangular shape as shown in FIG. 5). As shown in FIGS. 8 to 10, the module substrate 14 comprises, for example, a front insulating layer 31, back insulating layer 32, and thermal diffusion layers 33.

The front insulating layer 31 is a member that forms a front surface of the module substrate 14. The front insulating layer 31 is formed of a plate of an insulating material such as a synthetic resin, or more specifically, glass-epoxy resin. The back insulating layer 32, like the front insulating layer 31, is formed of an insulating material such as a synthetic resin, or more specifically, glass-epoxy resin. The back insulating layer 32 is a plate of the same size and thickness as the front insulating layer 31.

The thermal diffusion layers 33 are members that are located in an intermediate part of the module substrate 14 with respect to the thickness thereof. In the present embodiment, each thermal diffusion layer 33 is laminated to the entire area of one side of each of the front and back insulating layers 31 and 32. The thermal diffusion layers 33 are sandwiched between the front and back insulating layers 31 and 32 by laminating the two thermal diffusion layers 33 together. To attain this, the thermal diffusion layers 33 are disposed substantially throughout the module substrate 14.

Each thermal diffusion layer 33 is formed of a metal layer of the same size as the front and back insulating layers 31 and 32, e.g., a copper foil thinner than the insulating layers 31 and 32. A laminated structure comprising the front insulating layer 31 and thermal diffusion layer 33 thereon is identical with one comprising the back insulating layer 32 and thermal diffusion layer 33 thereon.

Two end fixing holes 14a are bored through each of two longitudinally opposite end parts of the module substrate 14. Further, a central fixing hole 14b and two through-holes 14c on the opposite sides thereof are formed in the central part of the module substrate. The central fixing hole 14b and through-holes 140 are arranged in a line. These holes 14b and 14c are used as parting points in doubling and parting the module substrate 14, if necessary.

The screws 12 to be screwed into base wall portion 3a are upwardly passed through the central fixing hole 14b and end fixing holes 14a, individually. The module substrate 14 is fixed to the base wall portion 3a by tightening the screws 12.

Specifically, the module substrate 14 is fixed to the lower surface of the base wall portion 3a with its front insulating layer 31 downward. If this is done, the back insulating layer 32 of the module substrate 14 comes into close contact with the base wall portion 3a. Thus, heat can be radiated from the light source modules 11 to the apparatus main body 2.

Figure 6:
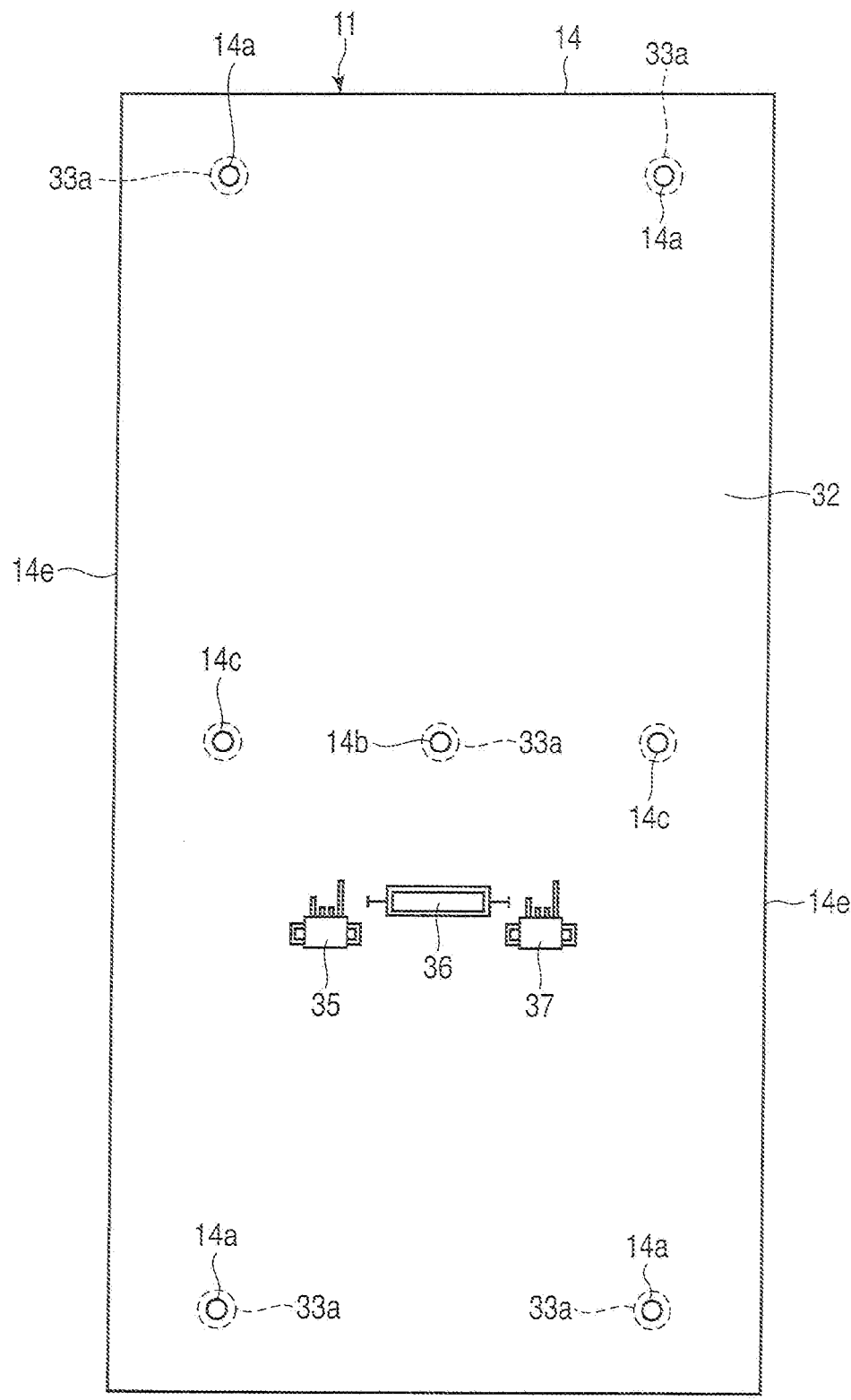
FIG. 6 is an exemplary top view showing the light source module of the lighting apparatus shown in FIG. 1.

In FIGS. 5, 6 and 10, number 33a denotes a first release hole. The first release hole 33a is bored in each thermal diffusion layer 33 in order to prevent conduction by contact between the screws 12 and the diffusion layers 33 and the like. In FIG. 9, number 33b denotes a second release hole. The second release hole 33b is bored in each thermal diffusion layer 33 in order to prevent conduction by contact between the diffusion layers 33 and through-holes (mentioned later) and the like.

Figure 7:
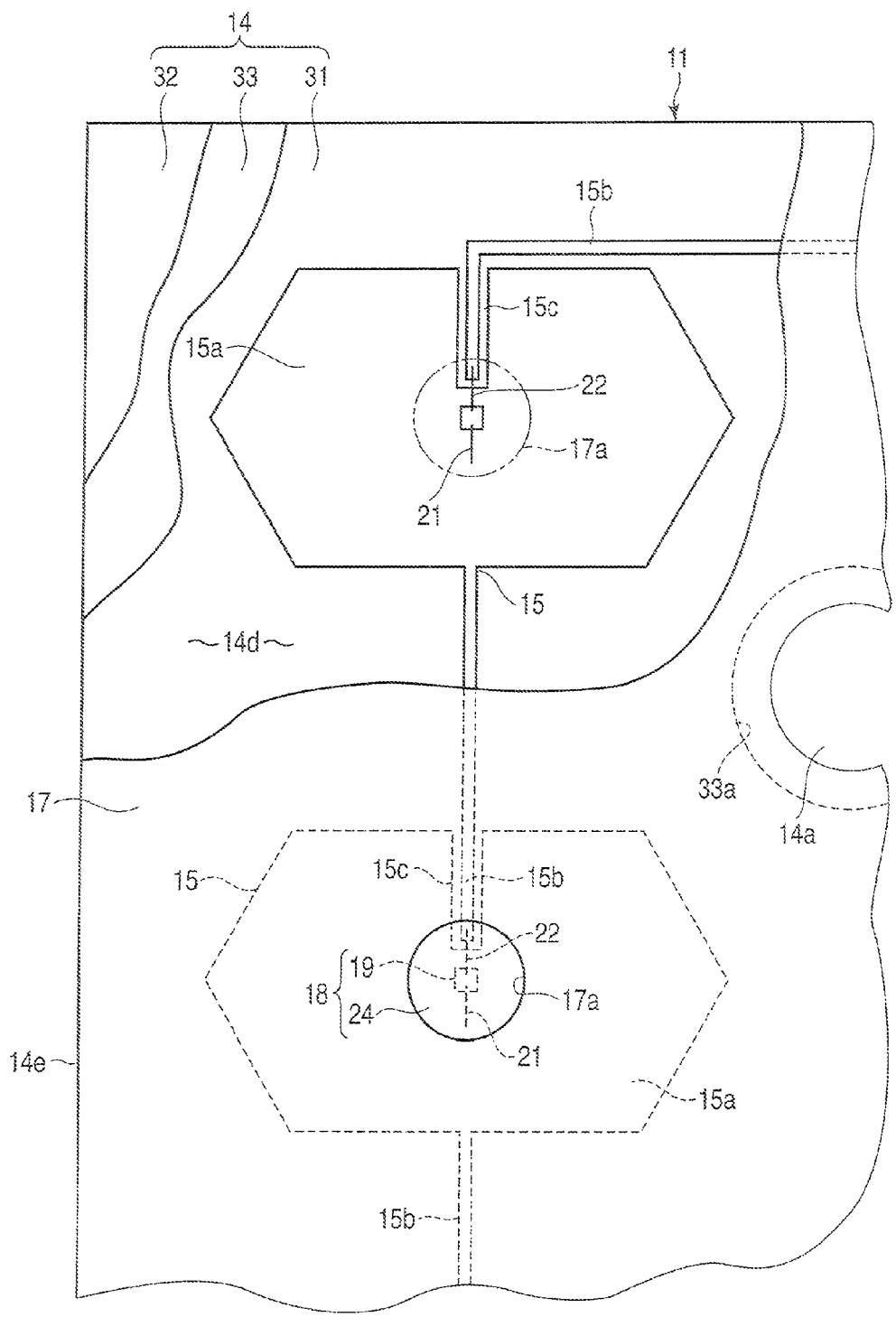
FIG. 7 is an exemplary enlarged cutaway bottom view showing the light source module shown in FIG. 1 and its diffuse reflection layer.

The metal conductors 15 (FIGS. 7 and 8) are arranged in a predetermined pattern on a front surface (i.e., lower surface) 14d of the module substrate 14. Each metal conductor 15 is formed by plating a copper foil attached to the lower surface 14d with gold or with a combination of nickel and gold alternately applied in the order named. As shown in FIG. 7, each metal conductor 15 comprises a device mounting portion 15a, extending portion 15b, and insulating groove portion 15c. The device mounting portion 15a is substantially hexagonal, for example. The extending portion 15b is a linear structure extending integrally from the mounting portion 15a. The insulating groove portion 15c is disposed at the device mounting portion 15a.

The width of the insulating groove portion 15c is greater than that of the extending portion 15b. The distal end of the insulating groove portion 15c reaches a substantially central part of the device mounting portion 15a. The insulating groove portion 15c is configured to receive the extending portion 15b of the metal conductor 15 that is located adjacent to it. As shown in FIG. 5, the respective device mounting portions 15a of the metal conductors 15 are arranged crisscross in a matrix on the module substrate 14.

The electrically insulating diffuse reflection layer 17 is formed of, for example, a white resist layer and is applied to the lower surface 14d of the module substrate 14 by printing. The diffuse reflection layer 17 is thinner than the blue LEDs 19 (mentioned later), as well as being much thinner than the module substrate 14. The reflectance of the diffuse reflection layer 17 may preferably be 85% or more. Preferably, moreover, low wettability may be imparted to the diffuse reflection layer 17.

As shown in FIGS. 7 and 8, the diffuse reflection layer 17 comprises holes 17a as many as the device mounting portions 15a. These holes 17a are arranged in the same manner as the mounting portions 15a and opposed individually to the respective central parts of the mounting portions 15a. Thus, the metal conductors 15 are covered by the diffuse reflection layer 17 except for those regions which face their corresponding holes 17a. Each hole 17a is, for example, a circular hole. As shown in FIG. 7, the respective distal end parts of the extending portion 15b and insulating groove portion 15c are located in each of the holes 17a.

As shown in FIG. 8, each blue LED 19 is formed by providing a luminescent layer 19b on one surface of an electrically insulating device substrate 19a of sapphire or the like. A pair of device electrodes (not shown) are disposed on the luminescent layer 19b. The blue LEDs 19 are thicker than the diffuse reflection layer 17.

Each of the blue LEDs 19 is die-bonded to the device mounting portion 15a of its corresponding metal conductor 15 with a die-bonding material 20. Each LED 19 mounted on the lower surface 14d of the module substrate 14 is located in the central part of its corresponding hole 17a. Thus, the blue LEDs 19 are arranged crisscross in a matrix corresponding to the holes 17a so as to cover a substantially entire area of the lower surface 14d.

Each blue LED 19 has a height greater than the thickness of the diffuse reflection layer 17. The "height of the blue LED 19" is a dimension from the lower surface 14d of the module substrate 14 to the distal end (i.e., lower end) of the blue LED 19. In other words, the height of the blue LED 19 is, for example, equal to the sum of the respective thicknesses of the LED 19 and die-bonding material 20. The distal end of each blue LED 19 projects below the lower surface of the diffuse reflection layer 17. The luminescent layer 19b of each blue LED 19 is located below the lower surface of the diffuse reflection layer 17.

Each blue LED 19 is electrically connected to the metal conductor 15 within the hole 17a in which it is located. Thus, as shown in FIGS. 7 and 8, one of the device electrodes of the blue LED 19 and the device mounting portion 15a are connected by a first bonding wire 21. Further, the other device electrode of the LED 19 and the extending portion 15b are connected by a second bonding wire 22. Thereupon, the blue LEDs 19 in the two left-side columns in FIG. 5 are connected in series, the ones in the two central columns in FIG. 5 are connected in series, and the ones in the two right-side columns in FIG. 5 are connected in series. These series circuits are electrically connected in parallel by circuits (not shown) and supplied with electricity by the glow starter 10. Thus, when the lighting apparatus 1 is in use, all the blue LEDs 19 glow together to serve for lighting.

As shown in FIG. 5, moreover, the columns of blue LEDs 19 extending along the length of the module substrate 14 are arranged at a fixed pitch P along the width (perpendicular to the length) of the module substrate 14. A distance L between each edge at which each two adjacent light source modules 11 contact each other, e.g., each of transverse side edges 14e of the module substrate 14, and the column of blue LEDs 19 nearest to the side edge 14e is half as long as the pitch P.

In the relationship between each two adjacent light source modules 11 arranged in this manner, the columns of blue LEDs 19 on the opposite sides of the side edge 14e of the module substrate 14 are located at a distance equal to the pitch P. Thus, all the columns of LEDs 19 in the sequentially adjacent light source modules 11 are arranged at the same pitch P (FIG. 3).

Unlike the case where the columns of blue LEDs 19 are irregularly arranged, therefore, the brightness of the translucent cover 27 (mentioned later) and a lighting area can be prevented from varying. Even if the cover 27 is so transparent that the light source modules 11 can be visually recognized or if the cover 27 is semitransparent or milky and allows luminous parts 18 (mentioned later) to be slightly reflected as luminescent spots in the cover, moreover, the intervals between the columns of blue LEDs 19 cannot be recognized as being irregular. This is a desirable condition for a good appearance of the lighting apparatus 1.

The sealing members 24 are formed of a translucent material, such as a transparent silicone resin, which is mixed with, for example, yellow phosphor powder. Each sealing member 24 is formed by feeding the material into its corresponding hole 17a by potting and then hardening it. The sealing member 24 is disposed on the lower surface 14d so as to bury or cover the central part of its corresponding device mounting portion 15a exposed in the hole 17a and each blue LED 19. The root of each potted sealing member 24 is stemmed by its corresponding hole 17a. Each sealing member 24 is, for example, a hemispherical member that projects below the lower surface of the diffuse reflection layer 17.

Figure 13:
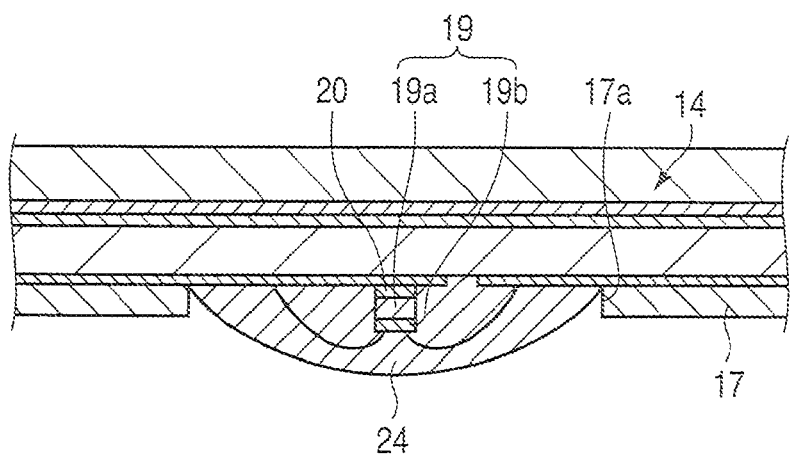
FIG. 13 is an exemplary sectional view showing a modification of the light source module shown in FIG. 8.

An example of each sealing member 24 is formed having a substantially spherical surface with a diameter-to-height ratio of, for example, 2.0~7.8 to 1. Thus, the sealing member 24 may be in the form of a hemisphere of which a radius and height are substantially equal, as shown in FIG. 8, or a flat spherical surface having a radius greater than its height, as shown in FIG. 13.

In the drawings, number 18 denotes each of the luminous parts. Each luminous part 18 comprises the sealing member 24 and the blue LED 19 embedded therein. The luminous parts 18 are arranged in the same manner as the LEDs 19. Thus, the luminous parts 18 are dotted in a matrix throughout the module substrate 14. The luminous parts 18 are arranged at intervals of 5 to 20 mm longitudinally and transversely relative to the module substrate 14. If the space between each two adjacent luminous parts 18 is less than 5 mm, the luminous parts 18 each comprising the blue LED 19 are arranged too densely. In this state, there are so many luminous fluxes per unit area that the mean luminance increases and discomfort glare is easily produced.

If the space between each two adjacent luminous parts 18 exceeds 20 mm, on the other hand, the luminous fluxes per unit area are reduced, so that the number of blue LEDs 19 used should be increased for compensation. Accordingly, the light source modules 11 need to be enlarged, so that the lighting apparatus 1 is inevitably large-sized.

In FIG. 5, the group of blue LEDs 19 in the two left-side columns comprises two opposite ends E of a first series circuit. The group of LEDs 19 in the two central columns comprises two opposite ends E of a second series circuit. The group of LEDs 19 in the two right-side columns comprises two opposite ends E of a third series circuit. As shown in FIG. 9, the module substrate 14 is penetrated by a through-hole 34 along its thickness. The opposite ends E of the first to third series circuits are integrally continuous with the through-hole 34.

The back insulating layer 32 that forms the reverse side of the module substrate 14 is provided with a reverse conductor 38 (representatively shown in FIG. 9) in a predetermined pattern. Electric components, which are non-luminous components, are mounted only on the reverse side of the module substrate 14 by being soldered to the reverse conductor 38. Specific examples of the non-luminous electric components include an electric connector 35, capacitor 36, constant-current diode 37 as a constant-current device, etc.

These electric components are collectively arranged, covering a central partial region surrounded by the peripheral part of the module substrate 14. The region in which these electric components are arranged is opposed to its corresponding component passage hole 3d when the module substrate 14 is fixed to the base wall portion 3a in the aforementioned manner. Therefore, the electric components, including the electric connector 35, capacitor 36, constant-current diode 37, etc., are passed through each component passage hole 3d, as representatively shown in FIG. 4.

Thus, the light source modules 11 are fixed to the base wall portion 3a of the apparatus main body 2 with the electric components passed through the component passage holes 3d. As this is done, each light source module 11 can be fixed in surface contact with the base wall portion 3a of the apparatus main body 2 without being hindered by the electric components mounted on the reverse side of the module 11.

The module substrate 14 constructed in this manner is attached to the base wall portion 3a by screws in such a manner that its length is perpendicular to that of the apparatus main body 2. As shown in FIGS. 3 and 4, the respective side edges 14e (FIGS. 5 and 7) of the adjacent module substrates 14 are in contact with one another. Thus, the module substrates 14 are sequentially arranged without gaps along the length of the apparatus main body 2.

The cover 27 is supported on the apparatus main body 2 so as to close its open bottom portion 4. The cover 27 covers the light source modules 11 from below. The cover 27 is supported by the main body 2 with its peripheral part placed on the base lower edge portions 3c of the main body base 3 and the lower edge portions 5a of the endplates 5. The cover 27 may be a transparent one so small in diffusivity that its diffusivity is negligible, milky one with high diffusivity, or semi-transparent one lower in diffusivity than the milky one. The cover 27 is selected depending on the operating environment of the lighting apparatus.

If the lighting apparatus 1 constructed in this manner is lit, all the blue LEDs 19 of the luminous parts 18 emit blue light, whereupon a space below the lighting apparatus 1 is illuminated. Specifically, the yellow phosphor contained in the sealing member 24 is excited as a part of the blue light emitted from the luminescent layer 19b of each blue LED 19 is transmitted through the sealing member 24.

Thus, white light is created as the yellow light produced by the excitation is mixed with that part of the blue light from the luminescent layer 19b which has not excited the phosphor. This white light is emitted downward from the luminous parts 18 and further transmitted through the translucent cover 27, whereby the region below the lighting apparatus 1 is illuminated in the direction of light application.

Each module substrate 14 of the lighting apparatus 1 comprises the white diffuse reflection layer 17 deposited on its lower surface 14d. The diffuse reflection layer 17 is thinner than each of the blue LEDs 19 mounted on the lower surface 14d. While the lighting apparatus 1 is on, the light from the respective luminescent layers 19b of the blue LEDs 19 is radiated in all directions.

Accordingly, the white light created in the luminous parts 18 based on light emitted horizontally and obliquely upward from the luminescent layers 19b is applied to the diffuse reflection layer 17 around the luminous parts 18 and diffusely reflected downward in the direction of light application by the reflection layer 17. Thus, although each luminous part 18, comprising the blue LED 19 and the sealing member 24 in which the LED 19 is embedded, is a high-luminance point light source, the luminance of the luminous part 18 can be prevented from becoming much higher than that in the periphery. Specifically, the luminance in the region just below each luminous part 18 is more reluctant to increase because the part of light which is applied to the diffuse reflection layer 17 is not emitted in the region just below each luminous part 18. Moreover, the luminance around the luminous part 18 is increased by the light diffusely reflected there, and the luminance ratio for this region with respect to the luminous part 18 is reduced.

Thus; unevenness of the luminance of each light source module 11 in which the dot-like luminous parts 18 are arranged in a matrix can be reduced. Since this results in a reduction of discomfort glare, the lighting apparatus 1 is improved in appearance.

In the present embodiment, moreover, the sidewall portions 3b and endplates 5 of the apparatus main body 2 form inclined reflected surfaces. Thus, the white light emitted sideways from the luminous parts 18 that are located near the sidewall portions 3b and endplates 5 is applied to them and reflected downward. Consequently, the luminance of the respective inner surfaces of the sidewall portions 3b and endplates 5 that are formed continuously with one another increases. Also in this connection, the light source modules 11 of the present embodiment can facilitate the reduction of the luminance unevenness and enhance the efficiency of utilization of light.

If the cover 27 of the lighting apparatus 1 is diffusive, the reduction of the luminance unevenness of the light source modules 11 can prevent the individual luminous parts 18 from being definitely reflected as high-luminance spots in the cover 27. In other words, the luminous parts 18 are less easily recognized as "lumpy" through the cover 27. Thus, the appearance of the lighting apparatus 1 can be improved.

In addition, the luminance unevenness caused by the dot-like luminous parts 18 of each light source module 11 can be reduced by the configuration of the module 11 itself described above, so that the translucent cover 27 need not be dedicated to the reduction. Accordingly, the luminance unevenness reduction performance required of the cover 27 can be mitigated. Thus, the low-diffusivity cover 27 can also be used in the lighting apparatus 1 that is employed in an operating environment where the luminance unevenness is a problem. As this is done, a loss of luminous energy in the cover 27 is reduced, so that a reduction in efficiency of the lighting apparatus 1 by the cover 27 can be mitigated.

Each light source module 11 of the lighting apparatus 1 of the one embodiment is 200 mm in longitudinal dimension and 100 mm in width dimension as in FIG. 5. The light source module 11 comprises six columns each including sixteen luminous parts 18. Each light source module 11 constructed in this manner has a sufficient performance to produce a luminous flux of 800 lm. The planar light source unit of the lighting apparatus 1 is formed by sequentially arranging the eight light source modules 11. Thus, the entire lighting apparatus 1 has a lamp luminous flux of (800×8) or 6,400 lm.

In the case of the lighting apparatus 1 configured so that the semitransparent cover 27 is combined with the planar light source unit of the above-described construction, its appliance luminous flux (luminous flux of the lighting apparatus 1) was found to be 6,100 lm by measurement. Thus, the efficiency of this lighting apparatus 1 was 95%. In the case of the lighting apparatus 1 that combines the milky cover 27 with the planar light source unit, moreover, the appliance luminous flux was found to be 5,750 lm by measurement. Thus, the efficiency of this lighting apparatus 1 was 90%.

In the case of the lighting apparatus of the configurations described in connection with the prior art example, on the other hand, the appliance efficiency for the configuration based on the combination with the semitransparent cover 27 is 90%, and that for the configuration based on the combination with the milky cover 27 is 85%. It was ascertained, therefore, that the lighting apparatus 1 of the present embodiment is improved by 5%. Thus, if the lighting apparatuses of the present embodiment and the prior art example are assumed to have the same luminance unevenness reduction performance, the diffusivity of the cover 27 of the lighting apparatus 1 of the present embodiment can be reduced.

In this manner, the luminance unevenness caused by the dot-like luminous parts 18 of each light source module 11 can be reduced by the configuration of the module 11. In the lighting apparatus 1 with the diffusive cover 27, therefore, the cover 27 opposed to the planar light source unit from below can be located nearer to the light source unit. Thus, the lighting apparatus 1 can be thinned. If the cover 27 is widely spaced apart from the planar light source unit without thinning the apparatus, the reflection of the luminous parts 18 into the cover 27 can be further obscured. Consequently, "lumpiness" attributable to the luminance unevenness at the cover 27 can be reduced.

Figure 12:
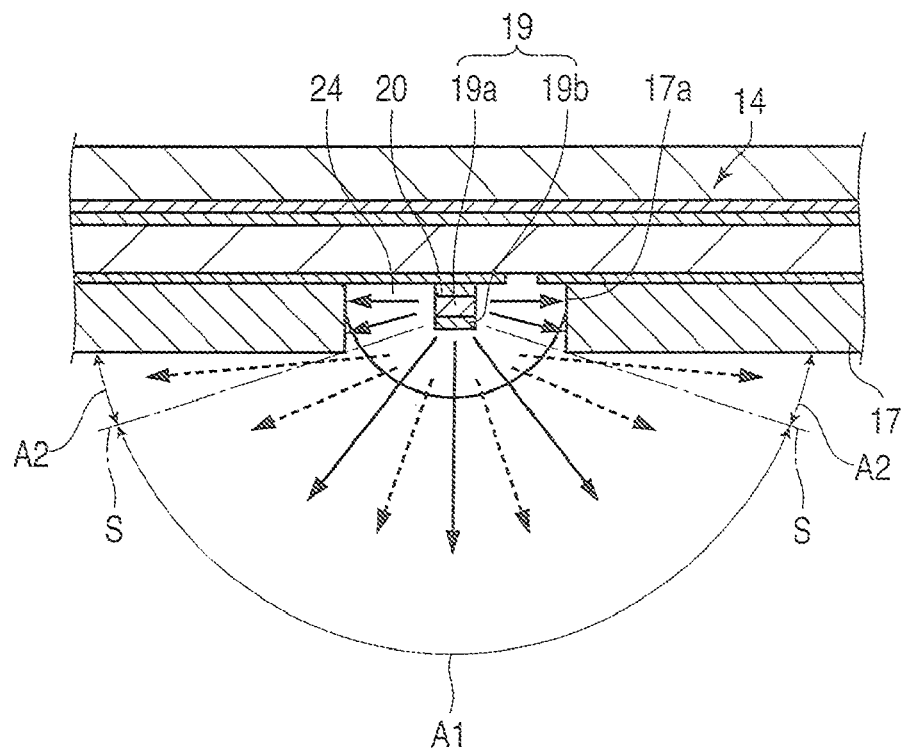
FIG. 12 is an exemplary sectional view showing a light source module related to the invention.

The following is a description of an angular color difference reduction effect based on the above-described configuration. For the sake of comparison, FIG. 12 shows a light source module of which the height of each blue LED 19 is smaller than the thickness of the diffuse reflection layer 17. As shown in FIG. 12, the blue LED 19 does not project below the diffuse reflection layer 17. Angular color differences are inevitably produced according to this configuration.

Solid-line arrows in FIG. 12 indicate blue light components emitted from the blue LED 19, that is, light components that are transmitted through the sealing member 24 without having excited the phosphor. On the other hand, broken-line arrows in FIG. 12 indicate yellow light components, that is, light components reflected by the phosphor of the sealing member 24. As mentioned before, white light is created as the blue and yellow light components are mixed.

An "emission angle" will be described first. The emission angle is an angle formed between a vertically downward direction as a reference)(0° and a direction in which light is emitted. Thus, a horizontal direction corresponds to an emission angle of 90°.

As shown in FIG. 12, blue light components are emitted radially from the blue LED 19 as a starting point. Those blue light components which are emitted, for example, vertically downward (emission angle at)0° or obliquely downward go out directly. On the other hand, those blue light components which are emitted in directions near the horizontal direction (emission angle at 90°) are not radiated to the outside, under the influence of reflection and light absorption by side faces of the diffuse reflection layer 17. Thus, no blue light components are emitted to regions A2 near the horizontal direction.

Meanwhile, the yellow light components are light components that are emitted by reflection by the grains of the phosphor of the sealing member 24. Therefore, the yellow light components are emitted in all directions of the sealing member 24 from a substantially entire portion of the sealing member without regard to the height of the blue LEDs 19. Thus, the yellow light components are emitted in directions near the horizontal direction, as well as vertically or obliquely downward.

As shown in FIG. 12, therefore, both the blue and yellow light components exist in region A1 vertically or obliquely below each luminous part 18, and they are mixed together so that the white light is emitted. In regions A2 near the horizontal direction of the luminous part 18, on the other hand, there are only the yellow light components, which are emitted as yellow light. In FIG. 12, line S connects the luminescent layer 19*b* of each blue LED 19 and the lower end of its corresponding hole 17*a*.

Thus, in the configuration shown in FIG. 12, the light components emitted to regions near the emission angle of 0° and horizontal direction (emission angle of 90°) have different colors, so that color differences are produced. When the cover 27 is attached, for example, such angular color differences cause color unevenness, e.g., a stripe of white and yellow, to develop on the cover 27. Even when the cover 27 is not attached, angular color differences, if any, inevitably cause illumination colors of two differently located luminaires (e.g., ones located vertically and obliquely above a user) to look differently.

In the configuration of the present embodiment, as shown in FIG. 11, on the other hand, the height of each blue LED 19 is greater than the thickness of the diffuse reflection layer 17, so that the LED projects below the layer 17.

According to this configuration, blue light components emitted in directions near the horizontal direction (emission angle of 90°) from the blue LEDs 19 are radiated to the outside without being greatly influenced by the reflection and light absorption by the side faces of the diffuse reflection layer 17. Thus, blue light components also exist in regions near the horizontal direction.

Thus, both the blue and yellow light components also exist in the regions near the horizontal direction of each luminous part 18, as well as in the region vertically or obliquely below the luminous part 18, and they are mixed together so that the white light is emitted. In other words, the white is emitted substantially in all directions of the luminous part 18 without regard to the emission angle. Consequently, color differences cannot be easily produced in the regions near the emission angle of 0° and the horizontal direction (emission angle of 90°), whereby production of angular color differences can be suppressed.

According to this arrangement, for example, color unevenness, such as a stripe of white and yellow, cannot be easily caused on the cover 27. In the case where the cover 27 is not attached, illumination colors of two differently located luminaires can be prevented from looking differently.

Further, the sealing member 24 of each luminous part 18 arranged in the aforementioned manner is stemmed by its corresponding hole 17*a* of the diffuse reflection layer 17. The sealing member 24 is disposed by potting. Specifically, each unhardened sealing member 24 potted during manufacture can be stemmed and prevented from further spreading by the hole 17*a* of the diffuse reflection layer 17 as it is hardened. In other words, the sealing members 24 can be prevented from overspreading the surface of the diffuse reflection layer 17. Thus, the sealing members 24 cannot be easily distorted.

If low wettability is imparted to the diffuse reflection layer 17, in particular, affinity between the unhardened sealing member 24 and diffuse reflection layer 17 is reduced by the wettability of the hole 17a and its surrounding area, so that the unhardened sealing member cannot easily overspread the surface of the reflection layer 17. Thus, the sealing member 24 can be more securely prevented from being distorted as it is hardened.

The low wettability can be imparted to the diffuse reflection layer 17 by mixing a low-wettability imparting agent, such as a fluorine material, more specifically, powder of tetrafluoro-ethylene resin powder, into the material of the reflection layer 17. Alternatively, the low wettability may be imparted by applying fluorine-based grease to or spraying and depositing a fluorine material on the surface of the reflection layer 17.

The production yield of the light source modules 11 is 90% in the case where the low wettability is not imparted to the diffuse reflection layer 17. In the case where the surface of the reflection layer 17 is coated with the fluorine-based grease, on the other hand, the production yield of the modules 11 is 95%. In the case where the fluorine material is sprayed and deposited on the surface of the reflection layer 17, the production yield of the modules 11 is 94%. Thus, it is confirmed that the yield is improved in any of these three cases.

As described above, the respective sealing members 24 of the luminous parts 18 can be easily formed into the same shape, so that conditions (e.g., thickness of the sealing member 24 including the phosphor) for exciting the respective phosphors of the luminous parts 18 are reluctant to variation. Therefore, white light components are created substantially in the same condition by the individual luminous parts 18, so that color unevenness attributable to the correlation between the luminous parts 18 cannot be easily caused. Such a reduction in color unevenness further improves the appearance of the lighting apparatus 1.

Since each hole 17a is circular, moreover, the potted sealing member 24 is hardened into a hemispherical shape. In each luminous part 18, therefore, differences cannot be easily produced between the respective lengths of optical paths from the luminescent layer 19b of the blue LED 19 to various parts of the surface of the sealing member 24, that is, between optical path lengths at various points of each luminous part 18. Consequently, color unevenness in each luminous part 18 cannot be easily caused either. Thus, such a reduction in color unevenness for each luminous part 18 can further improve the appearance of the lighting apparatus 1.

The lighting apparatus 1 constructed in this manner uses a yellow phosphor. Therefore, each luminous part 18 that comprises this phosphor and the translucent sealing member 24 mixed therewith is yellow. However, the luminous parts 18 are dotted in a matrix and dispersedly arranged throughout the module substrate 14. Accordingly, the module substrate 14 is not yellow as a whole. Thus, if the module substrate 14 is visually recognized through the translucent cover 27, the lighting apparatus 1 cannot be recognized as being strongly yellowish in an off-state or the like. As a result, the commodity value of the lighting apparatus 1 can be increased.

In the configuration in which the translucent sealing members 24 mixed with the yellow phosphor cover the entire lower surface of each light source module 11, moreover, both the phosphor and sealing members 24 are used in plenty. Since these materials are not low-priced, the lighting apparatus 1 is inevitably costly. According to the configuration of the present embodiment, as described above, however, the luminous parts 18 are dotted in a matrix and dispersedly arranged throughout the module substrate 14. Therefore, the phosphor and sealing members 24 used can be reduced in amount, so that the cost can be reduced.

The angular color differences of each light source module 11 are also influenced by the shape of each sealing member 24. In the configuration of the present embodiment, the sealing member 24 is formed having the substantially spherical surface with the diameter-to-height ratio of, for example, 2.0~7.8 to 1. According to this arrangement, the angular color differences can be further reduced. This condition will now be described in detail with reference to FIGS. 14 to 16. If a correlated color temperature difference is small, then an angular color difference will be small.

FIG. 16 shows relationships between the emission angle and correlated color temperature for some cases of different diameter-to-height ratios. The "diameter" as defined herein is the diameter of each sealing member 24. Thus, if the diameter-to-height ratio is 2.0, the sealing member 24 is hemispherical. As the diameter-to-height ratio increases, the sealing member 24 becomes more flat. As mentioned before, the "emission angle" is the angle formed between the vertically downward direction as the reference)(0°) and the direction in which light is emitted.

Figure 14:
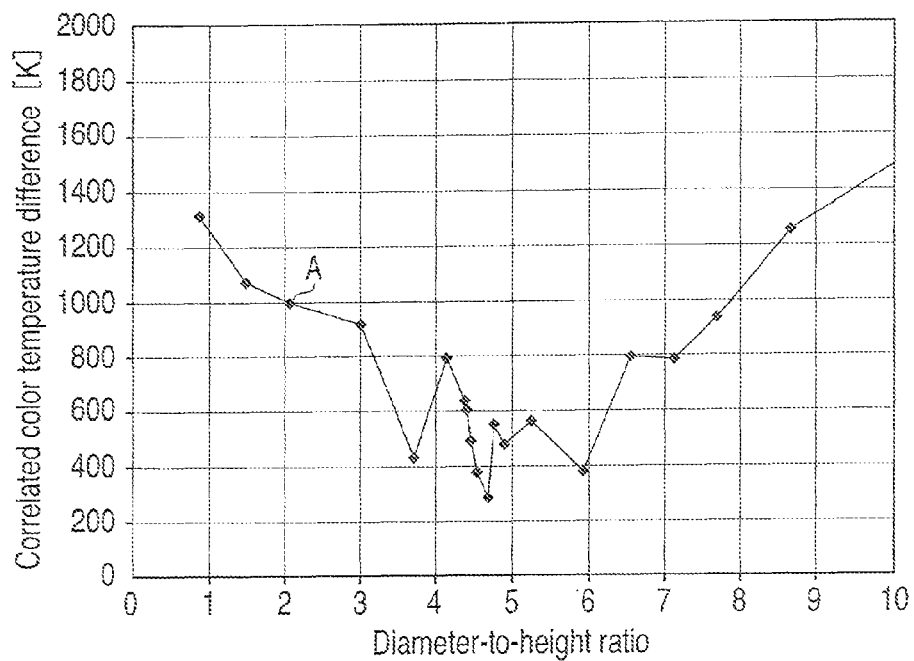
FIG. 14 is an exemplary diagram showing the relationship between the diameter-to-height ratio and correlated color temperature difference of the light source module shown in FIG. 8.

FIG. 14 shows the relationship between the diameter-to-height ratio and correlated color temperature difference. The "correlated color temperature difference" is the difference between maximum and minimum values of the correlated color temperature for an emission angle range from 0° to a predetermined value (e.g., 75°). For example, a point A in FIG. 14 indicates that the correlated color temperature difference is about 1,000 K when the diameter-to-height ratio is about 2.08. This is obtained based on the fact that a difference d between maximum and minimum values on a graph line of FIG. 16 for the diameter-to-height ratio of 2.08 is about 1,000 K.

Since most of the light that reaches the user is one that is emitted at an angle of 75° or less, correlated color temperature differences for the emission angle range of 0° to 75° are important. If the correlated color temperature difference exceeds 1,000 K, color unevenness begins to be relatively conspicuous. Thus, the maximum tolerable value of the correlated color temperature difference that does not discomfort the user can be said to be 1,000 K.

In the range where the diameter-to-height ratio of each sealing member 24 is 2.0~7.8 to 1, as shown in FIG. 14, the correlated color temperature difference is confined to 1,000 K or less. Within this range, the angular color difference is too small to be annoying to the user.

It is generally believed that the correlated color temperature for each emission angle depends on the length of an optical path from each blue LED 19 to the surface of the sealing member 24, that is, the optical path length at each point of each luminous part 18. If each sealing member 24 is hemispherical (i.e., if the diameter-to-height ratio 2.0 to 1), in this case, optical path lengths at various points are equal, so that the angular color difference should be the smallest.

Nevertheless, the above result of analysis indicates that the angular color difference is the smallest when each sealing member 24 is flatter than a hemisphere. In the range where the diameter-to-height ratio of the sealing member 24 is, for example, 4.4~6.2 to 1, the correlated color temperature difference is below 600 K, so that the angular color difference can be made smaller.

Figure 15:
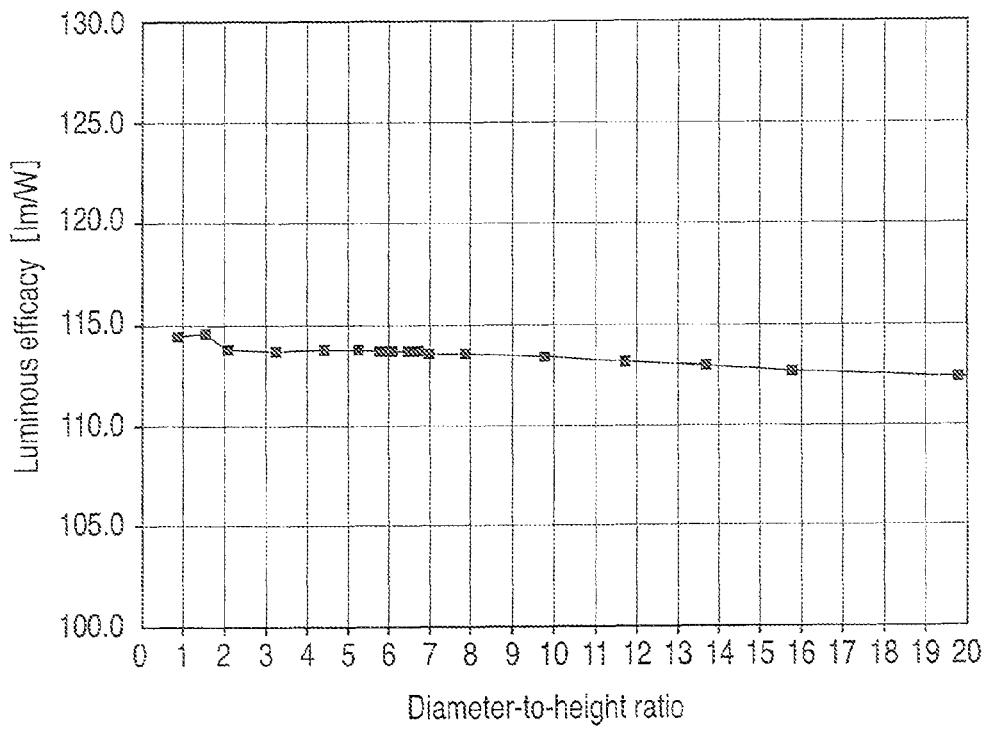
FIG. 15 is an exemplary diagram showing the relationship between the diameter-to-height ratio and luminous efficacy of the light source module shown in FIG. 8.

Experimental conditions for analyses of FIGS. 14 to 16 include a phosphor weight density of 10% and correlated color temperature of 5,000 K. If different phosphor densities are used with the correlated color temperature fixed, the shapes of the sealing members 24 are similarly varied in size. Even if the phosphor weight density varies, therefore, experimental conditions similar to the aforementioned ones can be obtained for the angular color difference. Further, the inventors hereof ascertained that experimental results similar to the aforementioned ones can also be obtained for all so-called white color temperatures (e.g., 4,000 to 6,000 K). Thus, the angular color difference can be reduced by confining the diameter-to-height ratio of each sealing member 24 to 2.0~7.8 to 1 without being restricted by the aforementioned experimental conditions.

FIG. 15 shows the relationship between the diameter-to-height ratio and luminous efficacy. As shown in FIG. 15, the luminous efficacy hardly varies even if the diameter-to-height ratio is greatly changed. Thus, the luminous efficacy of each light source module 11 is hardly reduced even if the shapes of the sealing members 24 are changed in order to make the correlated color temperature difference smaller.

The diameter-to-height ratio of each sealing member 24 within the range of 2.0~5.2 to 1 can be said to be preferable, since it can maintain a higher (though slightly) luminous efficacy. In consideration of robustness, moreover, the diameter-to-height ratio of each sealing member 24 may preferably be within the range of 5.2~7.8 to 1. If the diameter and height are, for example, 4 and 0.675 mm, respectively, the diameter-to-height ratio is 5.93. If the diameter and height change within the range of ±0.1 mm each, the ratio varies only from 5.29 to 6.78, indicating a restricted fluctuation.

Table 1 shows the relationship between the shape of each sealing member and luminous efficacy. In Table 1, "SMD" indicates a case where each sealing member containing a phosphor is poured into a cup-like depression. "flat" indicates a case where the entire lower surface of each light source module 11 is covered flat by sealing members containing a phosphor. "Dome" indicates a case where each sealing member containing a phosphor is formed with a substantially spherical surface, as in the present embodiment.

TABLE 1

|      | lm/W  | K    |
|------|-------|------|
| SMD  | 107.2 | 5000 |
| flat | 105.7 | 5000 |
| Dome | 113.7 | 5000 |

In the configuration of the present embodiment, the apparatus main body 2 including the base wall portion 3a may preferably be formed of a metal in order to radiate heat transmitted from the light source modules 11. The open bottom portion 4 of the apparatus main body 2 may be left open or closed by the translucent cover 27 supported by the main body 2. In the latter case, the cover 27 may be formed of a transparent material or diffusive material that diffuses light emitted from the light source modules 11 so that the luminous parts are not conspicuous.

According to the configuration of the present embodiment, the semiconductor light emitting elements (e.g., blue LEDs 19) are not located on the same surface of each module substrate 14 as the other non-luminous electric components (e.g., electric connector 35, capacitor 36, and constant-current diode 37). These electric components are located on the back surface of the module substrate 14 in a positional relation such that they overlie an arrangement region for the blue LEDs 19 on the front surface of the module substrate 14. Therefore, the module substrate 14 can be made smaller than in the case where the blue LEDs 19 and electric components are arranged on the same surface of the module substrate 14. This facilitates miniaturization of the lighting apparatus 1.

According to this configuration, moreover, the arrangement of the blue LEDs 19 on the front surface of each module substrate 14 is not influenced by the arrangement of the electric components, that is, electric connector 35, capacitor 36, and constant-current diode 37, on the back surface of the substrate 14. Thus, the blue LEDs 19 can be dotted substantially over the entire area of the module substrate 14 without being influenced by the arrangement of the electric components. Accordingly, no dark regions are produced by the arrangement of the electric components. Consequently, the light source modules 11 can be caused to emit light with uniform brightness in a planar manner.

According to the configuration described above, furthermore, each light source module 11 is fixed to the apparatus main body 2 in such a manner that the electric components are passed through each component passage component passage hole 3d in the base wall portion 3a of the main body 2. Thus, the back surface of the module substrate 14 can be brought into close contact with the base wall portion 3a without being hindered by the electric components mounted on the back surface of the light source module 11.

The blue LEDs 19 produce heat while the lighting apparatus 1 is on. Most of this heat is transmitted to the device mounting portions 15a and diffused corresponding to their areas. Then, this heat is transmitted from the mounting portions 15a to the thermal diffusion layers 33 through the front insulating layer 31 and diffused throughout the module substrate 14 by the diffusion layers 33. Subsequently, the heat is transmitted through the back insulating layer 32 to the base wall portion 3a in surface contact with the layer 32 and discharged from various parts of the apparatus main body 2 to the outside. As mentioned before, in this case, the back surface of the module substrate 14 is in close contact with the lower surface of the base wall portion 3a as a heat receiving surface without being hindered by the electric components on the back side of each light source module 11. Based on this surface contact, a satisfactory performance can be secured for thermal radiation from the module substrate 14 to the apparatus main body 2.

In this manner, the heat from each blue LED 19 can be efficiently discharged to the metallic apparatus main body 2 through the module substrate 14 with the thermal diffusion layers 33. Thus, an excessive temperature increase of each LED 19 can be suppressed along with a reduction in luminous efficacy and change in luminous color.

According to the configuration described above, moreover, each module substrate 14 comprises the front insulating layer 31 mounted with the blue LEDs 19, back insulating layer 32 mounted with the electric components, and thermal diffusion layers 33. The diffusion layers 33, which are sufficiently large to cover a substantially entire area of the module substrate 14, are sandwiched between the two insulating layers 31 and 32.

In this configuration, each of the front and back insulating layers 31 and 32 may be formed of a resin board of a glass-epoxy resin or the like, nonmetallic board of a paper-phenol material, glass composite, etc., or board of an inorganic material such as a ceramic. According to this invention, moreover, each thermal diffusion layer 33 may be a metal layer of, for example, copper.

In the configuration in which the base wall portion 3a as a heat receiving surface comprises the component passage holes 3d that accommodate the electric components, the thermal radiation performance of the regions opposed to the component passage holes 3d is poorer than those of the other regions. In the above-described configuration, however, each module substrate 14 comprises the thermal diffusion layers 33 that are sufficiently large to cover its substantially entire area. Therefore, heat from the semiconductor light emitting elements (e.g., blue LEDs 19) that are mounted on the regions opposed to the component passage holes 3d can be diffused throughout the module substrate 14, transmitted to the base wall portion 3a, and discharged to the outside. Such thermal radiation suppresses temperature differences between the semiconductor light emitting elements, so that color unevenness of the light source modules 11 attributable to variation of the luminous color of the semiconductor light emitting elements can be suppressed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A light source module comprising:
a module substrate;
a metal conductor provided in a predetermined pattern on a front surface of the module substrate;
a plurality of semiconductor light emitting elements electrically connected to the metal conductor and mounted on the front surface of the module substrate;
a white diffuse reflection layer comprising a plurality of holes in which the semiconductor light emitting elements are located, being thinner than the semiconductor light emitting elements, and laminated to the front surface of the module substrate; and
translucent sealing members burying the semiconductor light emitting elements and mixed with a phosphor, each of the sealing members having substantially spherical shape with a radius greater than a height, the spherical shape defined by a diameter-to-height ratio, wherein when the height is 1 the diameter is in a range from greater than 2.0 to 7.8,
wherein at least top portions of the sealing members project from the diffuse reflection layer, and
distal ends of the semiconductor light emitting elements project from the diffuse reflection layer.

2. A light source module of claim 1, wherein the sealing members are stemmed individually by the holes of the diffuse reflection layer.

3. A lighting apparatus comprising:
a light source module of claim 1;
an apparatus main body comprising a base wall portion and an open bottom portion underlying the base wall portion, the light source module being fixed to a lower surface of the base wall portion; and
a translucent cover supported by the apparatus main body, closing the open bottom portion, and covering the light source module from below.

4. A lighting apparatus of claim 3, wherein the sealing members are stemmed individually by the holes of the diffuse reflection layer.

* * * * *